United States Patent [19]
Noto et al.

[11] Patent Number: 5,350,965
[45] Date of Patent: Sep. 27, 1994

[54] PIEZOELECTRIC RESONATOR

[75] Inventors: Kazuyuki Noto; Takasi Yosinaga, both of Nagaokakyo, Japan

[73] Assignee: Myrata Manufacturing Co., Ltd., Japan

[21] Appl. No.: 88,512

[22] Filed: Jul. 6, 1993

[30] Foreign Application Priority Data

Jul. 7, 1992 [JP] Japan ............... 4-202953

[51] Int. Cl.$^5$ .................. H03H 9/17; H01L 41/08
[52] U.S. Cl. .................. 310/366; 310/320; 310/333
[58] Field of Search .......... 310/320, 333, 366

[56] References Cited

U.S. PATENT DOCUMENTS

| 3,676,724 | 7/1972 | Berlincourt et al. | 310/366 |
| 3,970,880 | 7/1976 | Deutschmann et al. | 310/366 |
| 4,066,986 | 1/1978 | Takano et al. | 310/366 |
| 4,642,505 | 2/1987 | Arvanitis | 310/320 |
| 4,833,430 | 5/1989 | Roberts et al. | 310/320 |
| 5,166,570 | 11/1992 | Takahashi et al. | 310/320 |

FOREIGN PATENT DOCUMENTS

| 2446430 | 8/1976 | Fed. Rep. of Germany | 310/320 |
| 2853834 | 6/1979 | Fed. Rep. of Germany | 310/320 |
| 0207018 | 9/1987 | Japan | 310/320 |
| 514111 | 1/1993 | Japan | H03H 9/17 |
| 514112 | 1/1993 | Japan | H03H 9/17 |

Primary Examiner—Thomas M. Dougherty
Attorney, Agent, or Firm—Ostrolenk, Faber, Gerb & Soffen

[57] ABSTRACT

A piezoelectric resonator vibrating in the thickness shear-slide mode comprises an elongated ceramic piezoelectric substrate, first and second terminal electrodes formed on both end portions of a front major surface thereof and first and a second vibrating electrodes connected with the first and the second terminal electrodes through first and second extracting electrodes respectively. A third terminal electrode is formed on a central portion of a rear major surface of the substrate, while a third vibrating electrode is formed at a position opposite to the first and the second vibrating electrodes, so that the third terminal electrode is connected with the third vibrating electrode through a third extracting electrode. An auxiliary electrode extends from the third vibrating electrode toward a position opposed to the first terminal electrode. An overlap area of the auxiliary electrode and the first terminal electrode is substantially equal to that of the second extracting electrode and the third terminal electrode. Thus, stray capacitance between the first and the third terminal electrodes and that between the second and the third terminal electrodes are balanced such that the piezoelectric resonator becomes electrically nonpolarized.

5 Claims, 2 Drawing Sheets

PIEZOELECTRIC RESONATOR

BACKGROUND OF THE INVENTION

The present invention relates to a piezoelectric resonator vibrating in the thickness shear-slide mode, and more particularly, it relates to an improvement in electric characteristics of such a piezoelectric resonator.

FIG. 5 shows a three-terminal ceramic discriminator, which is an example of a conventional piezoelectric resonator vibrating in the thickness shear-slide mode. The ceramic discriminator, which is applied to a phase shifting circuit for an FM demodulator circuit, comprises an elongated rectangular piezoelectric substrate 20. First and second terminal electrodes 21 and 22 are formed on both end portions of a major surface of the substrate 20, while first and second vibrating electrodes 23 and 24 are adjacently formed close to the terminal electrode 21. The first and second vibrating electrodes 23 and 24 are connected with the first and second terminal electrodes 21 and 22 through thin first and second extracting electrodes 25 and 26 respectively. On another major surface of the piezoelectric substrate 20, a third vibrating electrode 27 is formed to be opposite to the first and second vibrating electrodes 23 and 24, while a third terminal electrode 29 is formed on a central portion of the substrate 20 to be connected to the third vibrating electrode 27 through a third extracting electrode 28. Lead terminals (not shown), for example, are soldered to the terminal electrodes 21, 22 and 29.

In the aforementioned piezoelectric resonator, however, the second extracting electrode 26 connecting the second vibrating electrode 24 with the second terminal electrode 22 is opposed to the third terminal electrode 29 in a area S shown by slant lines in FIG. 5. Therefore, an stray capacitance is caused between the second extracting electrode 26 and the third terminal electrode 29, and hence a capacitance between the first and the third terminal electrodes 21 and 29 differs from that between the second and the third terminal electrodes 22 and 29 so as to cause electrical polarity. Therefore, if input and output terminals of this resonator are reversely connected on a printed circuit board, electric characteristics are inevitably varied. Thus, it is necessary to check the terminal direction of the resonator when it is connected on a printed circuit board.

SUMMARY OF THE INVENTION

Accordingly, an object of the present invention is to provide an electrically nonpolarized piezoelectric resonator by balancing capacitances between terminals.

Another object of the present invention is to provide a piezoelectric resonator which is easy to manufacture without increasing the manufacturing steps as compared with the prior art.

Still another object of the present invention is to provide a piezoelectric resonator which is suitable for an automatically mounted component.

The present invention provides a piezoelectric resonator vibrating in the thickness shear-slide mode, which comprises a piezoelectric ceramic substrate, first and second terminal electrodes formed on both end portions of a front major surface thereof, and a third terminal electrode formed at an intermediate position of a rear major surface thereof. On the front major surface of the substrate a first and second vibrating electrodes are adjacently formed on intermediate positions between the first terminal electrode and a portion opposed to the third terminal electrode, so that the first and the second terminal electrodes are connected with the first and the second vibrating electrodes through a first and a second extracting electrodes respectively. The second extracting electrode is arranged to be partially opposed to the third terminal electrode with the substrate therebetween. On the rear surface of the substrate a third vibrating electrode is formed at a position opposed to the first and the second vibrating electrodes, and a third extracting electrode is formed to connect the third terminal electrode with the third vibrating electrode. In such a piezoelectric resonator, an auxiliary electrode which extends from the third vibrating electrode to a position opposed to the first terminal electrode is formed on the rear major surface of the substrate so that an overlap area of the auxiliary electrode and the first terminal electrode is substantially equal to that of the second extracting electrode and the third terminal electrode.

Due to the aforementioned structure, stray capacitances are caused not only between the second extracting electrode and the third terminal electrode but also between the auxiliary electrode and the first terminal electrode. Since the overlap area of the auxiliary electrode and the first terminal electrode is substantially equal to that of the second extracting electrode and the third terminal electrode, the aforementioned two stray capacitances are substantially equal to each other. Therefore, the capacitance between the first and the third terminal electrodes and that between the second and the third terminal electrodes are so balanced that the piezoelectric resonator becomes electrically nonpolarized. Therefore, it is possible to reverse the directions of input and output sides of the resonator when it is mounted on a printed circuit board. This means that the piezoelectric resonator of the present invention is suitable for an automatically mounted component.

When a lead terminal is soldered to the first terminal electrode which is opposed to the auxiliary electrode, undesired vibration between the first terminal electrode and the auxiliary electrode is suppressed due to solder dumping. Thus, the characteristics of the piezoelectric resonator remaining substantially unchanged.

When the terminal electrodes are formed by strip electrodes which extend along shorter edges of the piezoelectric substrate, the piezoelectric resonator can be easily manufactured by forming electrode patterns on a mother substrate by a well-known method and cutting the mother substrate in a constant width. In this case, the auxiliary electrode can be simultaneously formed with the remaining electrodes which are formed on the mother substrate, whereby it is not necessary to increase the manufacturing steps.

When the first and the third terminal electrodes are formed with equal widths and the auxiliary electrode and the second extracting electrode are also formed with equal width, the overlap area of the auxiliary electrode and the first terminal electrode can be easily made equal to that of the second extracting electrode and the third terminal electrode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
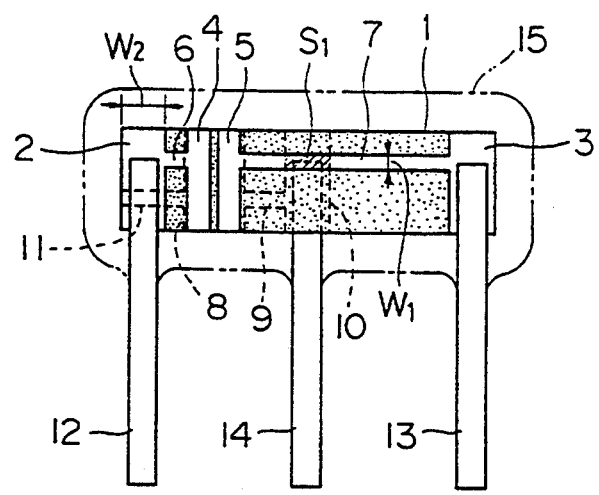
FIG. 1 is a front elevational view showing a first embodiment of a piezoelectric resonator according to the present invention.
Figure 2:
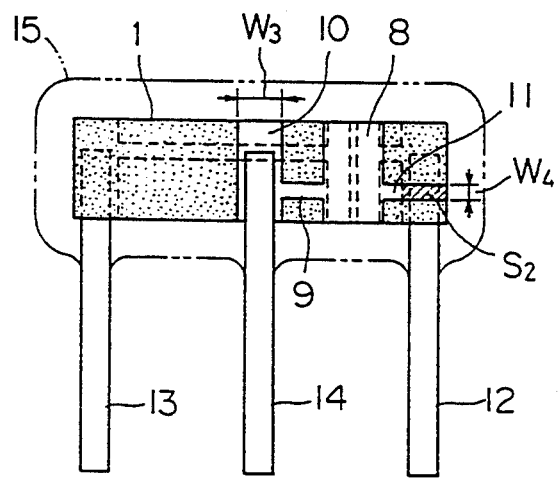
FIG. 2 is a rear elevational view of the piezoelectric resonator shown in FIG. 1.

FIGS. 1 and 2 illustrate an energy trapped type piezoelectric resonator vibrating in the thickness shearslide mode according to an embodiment of the present invention. A piezoelectric substrate 1, which is formed by an elongated rectangular ceramic plate, is polarized along longer edges thereof. First second terminal electrodes 2 and 3 are formed on both end portions of a front major surface of the substrate 1, while first and second vibrating electrodes 4 and 5 are adjacently formed on positions which are closer to the first terminal electrode 2 of the front major surface of the substrate 1. These electrodes 2, 3, 4 and 5 are formed by strip electrodes which extend along shorter edges of the substrate 1. The first and the second terminal electrodes 2 and 3 are connected with the first and the second vibrating electrodes 4 and 5 through first and second extracting electrodes 6 and 7 respectively. The first and the second extracting electrodes 6 and 7, extending along the longer edges of the substrate 1, have widths (dimensions along the shorter edges of the substrate 1) $W_1$ which are smaller than widths (dimensions along the longer edges of the substrate 1) $W_2$ of the first and the second terminal electrodes 2 and 3. A wide third vibrating electrode 8 which is opposed to the first and the second vibrating electrodes 4 and 5 is formed on a rear major surface of the substrate 1. Also, a third terminal electrode 10 which is connected to the third vibrating electrode 8 through a third extracting electrode 9 is formed on a central portion of the rear major surface of the substrate 1. Further, the third terminal electrode 10 is formed by a strip electrode which extends along the shorter edges of the substrate 1, and its width (dimension along the longer edges of the substrate 1) $W_3$ is substantially equivalent to the width $W_2$ of the first terminal electrode 2. An auxiliary electrode 11 is extended from the third vibrating electrode 8 to a position opposed to the first terminal electrode 2. This auxiliary electrode 11 has a width (dimension along the shorter edges of the substrate 1) $W_4$ which is substantially equivalent to the width $W_1$ of the second extracting electrode 7.

The first extracting electrode 6 and the auxiliary electrode 11 are not opposed to each other, while the second and the third extracting electrodes 7 and 9 are not opposed to each other.

Lead terminals 12, 13 and 14 are soldered to the terminal electrodes 2, 3 and 10 respectively. The lead terminal 12 is an input (or output) terminal, the lead terminal 13 is an output (or input) terminal, and the lead terminal 14 is a grounding terminal.

The periphery of the substrate 1 is coated with an elastic material (not shown) such as silicone rubber, and the periphery of this elastic material is further coated with an epoxy protective resin member 15. Such a structure is well known in the art, and hence redundant description is omitted.

In the piezoelectric resonator having the aforementioned structure, a stray capacitance is caused between the second extracting electrode 7 and the third terminal electrode 10 since these electrodes 7 and 10 are opposed to each other in an area $S_1$ shown by slant lines in FIG. 1. Another stray capacitance is also caused between the auxiliary electrode 11 and the first terminal electrode 2 since they are opposed to each other in an area $S_2$ shown by slant lines in FIG. 2. The first and the third terminal electrodes 2 and 10 are substantially equivalent in width to each other ($W_2 \approx W_3$) while the second extracting electrode 7 and the auxiliary electrode 11 are also substantially equivalent in width to each other ($W_1 \approx W_4$), whereby the areas $S_1$ and $S_2$ become substantially equal to each other. Therefore, the aforementioned two stray capacitances are substantially identical to each other. Thus, capacitance between the first and the third terminal electrodes 2 and 10 and that between the second and the third terminal electrodes 3 and 10 are so balanced that the piezoelectric resonator becomes electrically nonpolarized.

Both of the second extracting electrode 7 and the auxiliary electrode 11 are so thin that the stray capacitances thereof are small. Thus, a slight difference between the widths $W_2$ and $W_3$ and that between the widths $W_1$ and $W_4$ cause substantially no problem in the electric polarity.

Figure 3:
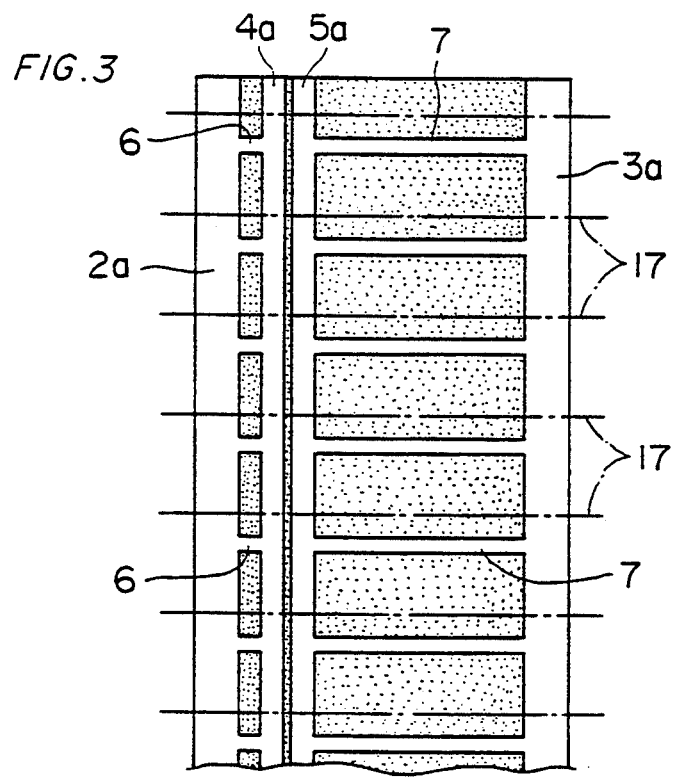
FIG. 3 is a front elevational view showing a mother substrate for producing the piezoelectric resonator shown in FIG. 1.
Figure 4:
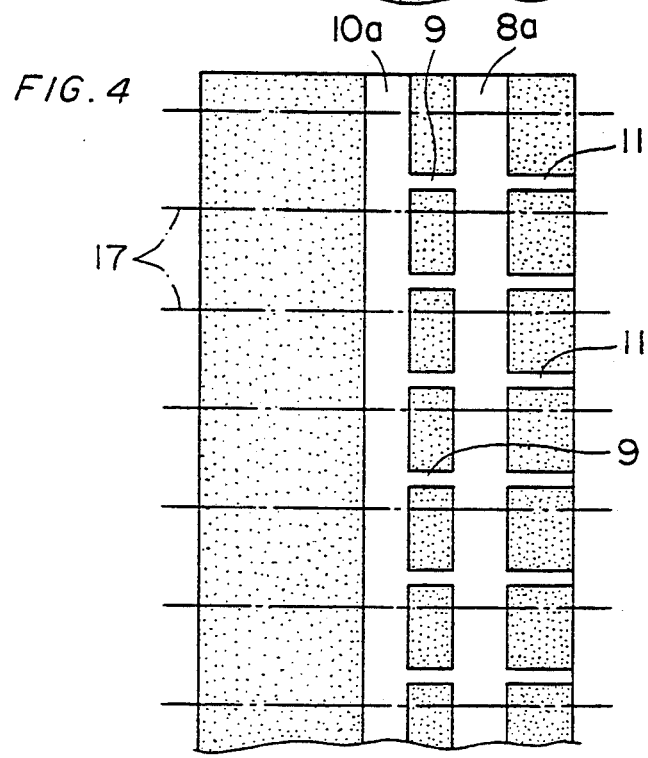
FIG. 4 is a rear elevational view of the mother substrate shown in FIG. 3.
Figure 5:
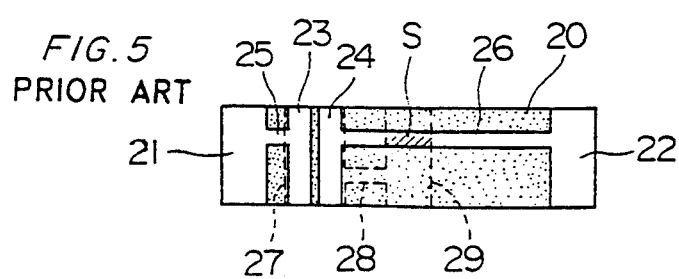
FIG. 5 is a front elevational view showing a conventional piezoelectric resonator.

FIGS. 3 and 4 illustrate a mother substrate 16 for producing the aforementioned piezoelectric resonator.

This mother plate 16 is formed by a ceramic plate having a width along its shorter edge direction which is identical to the width of the piezoelectric substrate 1 along its longer edge direction. Electrode patterns are formed on front and rear surfaces of this mother plate 16 by a well-known method such as screen printing, sputtering or vapor deposition. The mother plate 16 is provided on its front surface with four strip electrodes 2a, 3a, 4a and 5a which extend along the longer edges. The electrode 2a corresponds to the first terminal electrode 2, the electrode 3a corresponds to the second terminal electrode 3, the electrode 4a corresponds to the first vibrating electrode 4, and the electrode 5a corresponds to the second vibrating electrode 5 respectively. The mother plate 16 is further provided on its rear surface with two strip electrodes 8a and 10a which extend along the longer edges. The electrode 8a corresponds to the third vibrating electrode 8, while the electrode 10a corresponds to the third terminal electrode 10 respectively. Further, thin extracting electrodes 6 and 7 are formed on the front surface of the mother plate 16 while thin extracting electrodes 9 and auxiliary electrodes 11 are formed on the rear surface thereof.

By cutting the mother plate 16 with the aforementioned electrode patterns along one-dot chain lines 17 as shown in FIGS. 3 and 4, it becomes possible to produce the piezoelectric resonator shown in FIGS. 1 and 2.

When the electrode patterns are formed on the mother plate 16, the front and rear patterns may slightly deviate from each other along the longer or shorter edges. Even if such deviation occurs, the overlap areas of the auxiliary electrode 11 and the first terminal electrode 2 and that of the second extracting electrode 7 and the third terminal electrode 10 remain unchanged because the auxiliary electrode 11 and the first terminal electrode 2 as well as the second extracting electrode 7 and the third terminal electrode 10 are crossed perpendicular to each other. Thus, dispersion between the stray capacitances is reduced. This brings such an advantage that high positional accuracy is not required for forming the electrode patterns.

The present invention is not restricted to the aforementioned radial lead component having the lead terminals 12, 13 and 14 which are soldered to the terminal electrodes 2, 3 and 10, but is also applicable to a chip type component. In this case, the piezoelectric resonator is packaged in an insulating case, which is provided on its inner surface with an electrode film connected to the terminal electrodes of the piezoelectric resonator by a conductive adhesive. This electrode film is further drawn out to the outer surface of the case so as to serve as an electrode to be connected with the exterior. Since this structure is well known in the art, redundant description is omitted.

The present invention is not restricted to a ceramic discriminator, but is also applicable to another type of piezoelectric resonator such as a ceramic filter, as a matter of course.

Further, the position of the third terminal electrode is not restricted to the central portion of the piezoelectric substrate. The third terminal electrode is possibly located at any position which does not oppose the first or the second terminal electrode.

Moreover, the positions of the first and the second vibrating electrodes are not restricted to the portions which are closer to the first terminal electrode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezoelectric resonator vibrating in a thickness shear-slide mode, comprising:
   an elongated ceramic piezoelectric substrate;
   a first terminal electrode and a second terminal electrode formed on end portions of a front major surface of said piezoelectric substrate;
   a third terminal electrode formed at an intermediate position of a rear major surface of said piezoelectric substrate;
   a first vibrating electrode and a second vibrating electrode adjacently formed on said front major surface of said piezoelectric substrate at intermediate positions between said first terminal electrode and a portion of said piezoelectric substrate opposed to said third terminal electrode;
   a first extracting electrode and a second extracting electrode formed on said front major surface of said piezoelectric substrate for connecting said first and second terminal electrodes with said first and second vibrating electrodes respectively, said second extracting electrode being arranged to be partially opposed to said third terminal electrode with said piezoelectric substrate therebetween;
   a third vibrating electrode formed on said rear major surface of said piezoelectric substrate in a position opposed to said first and second vibrating electrodes;
   a third extracting electrode formed on said rear major surface of said piezoelectric substrate for connecting said third terminal electrode with said third vibrating electrode;
   an auxiliary electrode extending from said third vibrating electrode to a position opposed to said first terminal electrode and being formed on said rear major surface of said piezoelectric substrate; wherein
   an overlap area of said auxiliary electrode and said first terminal electrode is substantially equal to an overlap area of said second extracting electrode and said third terminal electrode.

2. A piezoelectric resonator in accordance with claim 1, wherein
   said first, second and third terminal electrodes are strip electrodes extending in a direction perpendicular to a longitudinal direction of said piezoelectric substrate.

3. A piezoelectric resonator in accordance with claim 1, wherein
   said first, second and third extracting electrodes and said auxiliary electrode are strip electrodes extending in a direction parallel to a longitudinal direction of said piezoelectric substrate and having thinner widths than said first, second and third terminal electrodes.

4. A piezoelectric resonator in accordance with claim 1, wherein
   said first and third terminal electrodes are strip electrodes extending in a direction perpendicular to a longitudinal direction of said piezoelectric substrate and having substantially identical widths along longer edges of said piezoelectric substrate, and
   said auxiliary electrode and said second extracting electrode are strip electrodes extending in a direction parallel to a longitudinal direction of said piezoelectric substrate and having substantially identical widths along said shorter edges of said piezoelectric substrate.

5. A piezoelectric resonator in accordance with claim 1, wherein
   lead terminals are soldered to said first, second and third terminal electrodes respectively.

* * * * *